US008881385B2

(12) United States Patent
Endo et al.

(10) Patent No.: US 8,881,385 B2
(45) Date of Patent: Nov. 11, 2014

(54) NOZZLE PLACEMENT MANAGEMENT METHOD

(75) Inventors: Tadashi Endo, Fukuoka (JP); Hironori Kitashima, Saga (JP)

(73) Assignee: Panasonic Corporation, Osaka (JP)

( * ) Notice: Subject to any disclaimer, the term of this patent is extended or adjusted under 35 U.S.C. 154(b) by 1221 days.

(21) Appl. No.: 12/740,230

(22) PCT Filed: Nov. 4, 2008

(86) PCT No.: PCT/JP2008/003167
§ 371 (c)(1),
(2), (4) Date: Apr. 28, 2010

(87) PCT Pub. No.: WO2009/060589
PCT Pub. Date: May 14, 2009

(65) Prior Publication Data
US 2010/0229380 A1 Sep. 16, 2010

(30) Foreign Application Priority Data

Nov. 9, 2007 (JP) ................................ P2007-291488

(51) Int. Cl.
*H05K 3/34* (2006.01)
*H05K 13/04* (2006.01)
*H05K 13/08* (2006.01)

(52) U.S. Cl.
CPC ........ *H05K 13/0452* (2013.01); *H05K 13/0408* (2013.01); *H05K 13/08* (2013.01)
USPC ................................. 29/840; 29/825; 29/832

(58) Field of Classification Search
USPC ....................... 700/60, 160, 301, 900; 29/840
See application file for complete search history.

(56) References Cited

U.S. PATENT DOCUMENTS

| 6,519,838 | B1 | 2/2003 | Okuda et al. | |
|---|---|---|---|---|
| 2002/0073536 | A1 | 6/2002 | Okuda et al. | |
| 2006/0111222 | A1 | 5/2006 | Yasui | |
| 2008/0147232 | A1* | 6/2008 | Kuribayashi et al. | 700/160 |
| 2010/0229380 | A1* | 9/2010 | Endo et al. | 29/760 |
| 2012/0004759 | A1* | 1/2012 | Ishimoto | 700/117 |

FOREIGN PATENT DOCUMENTS

| JP | 10-70395 A | 3/1998 |
|---|---|---|
| JP | 10-270897 A | 10/1998 |
| JP | 2003-133791 A | 5/2003 |
| JP | 2003-224394 A | 8/2003 |
| JP | 2003-283190 A | 10/2003 |
| JP | 2004-103922 A | 4/2004 |
| JP | 2005-244175 A | 9/2005 |
| WO | 2004/66701 A1 | 8/2004 |
| WO | 2006/035651 A1 * | 4/2006 |

OTHER PUBLICATIONS

International Search Report for PCT/JP2008/003167.

* cited by examiner

*Primary Examiner* — Carl Arbes
(74) *Attorney, Agent, or Firm* — Pearne & Gordan LLP (57) ABSTRACT

A nozzle placement history data management method is accomplished by an electronic component mounting apparatus having an adsorption nozzle detachably placed on a mount head. The presence or absence of the adsorption nozzle is detected by a flow rate sensor. A board recognition camera provides identification information of the nozzle with the result that the nozzle placement history data can be updated, managed and updated.

3 Claims, 9 Drawing Sheets

NOZZLE PLACEMENT MANAGEMENT METHOD

TECHNICAL FIELD

This invention relates to an electronic component mounting apparatus for mounting an electronic component on a board with an adsorption nozzle detachably placed in a mount head and a nozzle placement history data management method of managing placement history data of an adsorption nozzle in a mount head in the electronic component mounting apparatus.

BACKGROUND ART

A component holder of an adsorption nozzle, etc., for holding an electronic component is detachably placed on a mount head for taking out an electronic component from a component supply section and moving and mounting it to and on a board in an electronic component mounting apparatus. The component holder is provided for each type of electronic component to be mounted and if a part abutting an electronic component is worn and becomes impossible to use, it is replaced with a new one.

In recent years, in an electronic component manufacturing industry, production management has been made fine for the purpose of ensuring the manufacturing quality and improving the production efficiency; there has been a demand for not only providing a component history used in product assembly, but also determining tools used in the manufacturing process individually. Thus, a bar code is applied to a parts cassette, an adsorption nozzle, etc., used in an electronic component mounting apparatus as identification information to make it possible to identify each device (for example, refer to Patent Document 1). When a parts cassette or an adsorption nozzle is placed, the bar code is read automatically, whereby the correct and the incorrect can be reliably checked as to whether or not a correct component and a correct tool are used in the component mounting operation and the read result is read, whereby it is made possible to acquire history data on production management and quality management.

Patent Document 1: Japanese Patent Laid-Open No. 2005-244175

DISCLOSURE OF THE INVENTION

Problems to be Solved by the Invention

However, for a tool attached and detached in the operation continuation process of an electronic component mounting apparatus, such as an adsorption nozzle, to correctly acquire history data, the following problem occurs: A machine operator for monitoring the operation state of the electronic component mounting apparatus always pays attention to the tool function of the adsorption nozzle and if the electronic component mounting apparatus stops operation for some machine trouble, the machine operator performs necessary maintenance inspection work. At this time, if a component adsorption mistake caused by the adsorption nozzle repeatedly occurs, the machine operator removes the adsorption nozzle by manual operation and if the machine operator finds an anomaly of nozzle clogging, etc., he or she replaces the adsorption nozzle with a new good adsorption nozzle.

In such a case, however, automatic read of identification information of a bar code, etc., is not executed and thus although the adsorption nozzle is replaced, as the nozzle placement history information, the identification information of the previously placed adsorption nozzle is held as data as it is, and the reliability of the nozzle placement history data is impaired. Thus, in the conventional electronic component mounting apparatus, there is a problem in that the nozzle placement history data is not correctly managed and data reliability is degraded because of intervention of manual operation of the machine operator.

It is therefore an object of the invention to provide an electronic component mounting apparatus and a nozzle placement history data management method for making it possible to correctly manage nozzle placement history data and ensure data reliability.

Means for Solving the Problems

An electronic component mounting apparatus of the invention is an electronic component mounting apparatus for picking up an electronic component by vacuum adsorption from a component supply section with an adsorption nozzle detachably placed on a mount head and mounting the electronic component on a board, and includes an identification information read section for reading identification information given to the adsorption nozzle, an identification information storage section for storing the identification information read by the identification information read section as placement history data of the adsorption nozzle in the mount head, a nozzle presence/absence detection section for detecting the presence or absence of the adsorption nozzle in the mount head, and an again-placing detection section for detecting that the adsorption nozzle is once removed and then is again placed by a machine operator based on the detection result of the nozzle presence/absence detection section.

In an electronic component mounting apparatus for picking up an electronic component by vacuum adsorption from a component supply section with an adsorption nozzle detachably placed on a mount head and mounting the electronic component on a board, a nozzle placement history data management method of the invention is a nozzle placement history data management method of managing placement history data of the adsorption nozzle in the mount head, wherein the electronic component mounting apparatus includes an identification information read section for reading identification information given to the adsorption nozzle, an identification information storage section for storing the read identification information, and a nozzle presence/absence detection section for detecting the presence or absence of the adsorption nozzle in the mount head, and wherein it is detected that the adsorption nozzle is once removed and then is again placed by a machine operator based on the detection result of the nozzle presence/absence detection section.

Advantages Of The Invention

According to the invention, the electronic component mounting apparatus includes the nozzle presence/absence detection section for detecting the presence or absence of the adsorption nozzle in the mount head and the again-placing detection section for detecting that the adsorption nozzle is once removed and then is again placed by the machine operator based on the detection result of the nozzle presence/absence detection section, whereby when the machine operator again places adsorption nozzle by manual operation, it is made possible to perform the identification information read operation as required, and the nozzle placement history data can be correctly updated and managed and data reliability can be ensured.

DESCRIPTION OF REFERENCE NUMERALS

3 Board
4 Component supply section
8 Mount head
8a Unit mount head
8b Nozzle placement part
9 Board recognition camera
11 Nozzle stocker
13 Cover door
15 Operation panel
16 Display panel
20 Adsorption nozzle
21 Two-dimensional bar code label

BEST MODE FOR CARRYING OUT THE INVENTION

Figure 1:
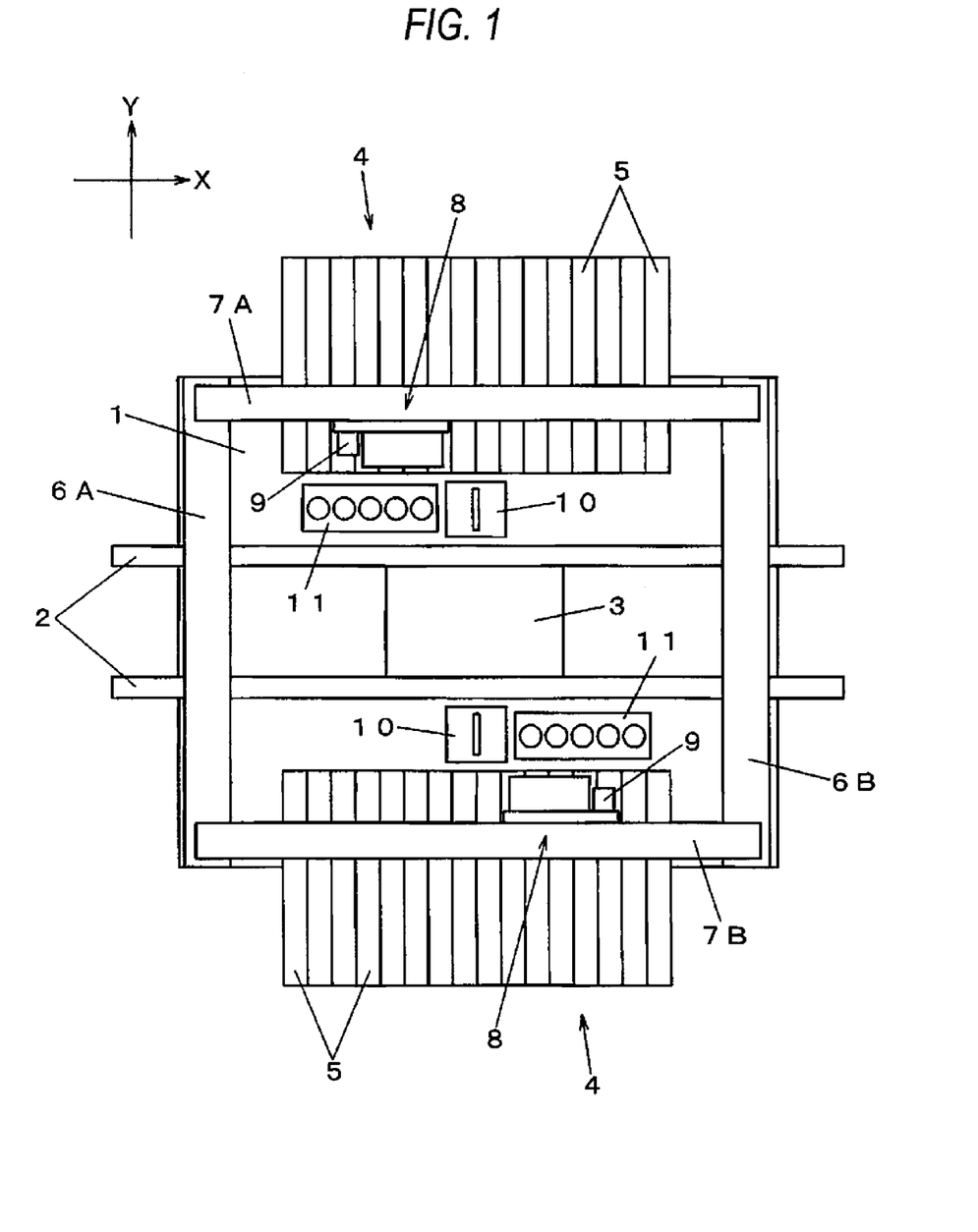
FIG. 1 is a plan view of an electronic component mounting apparatus of one embodiment of the invention.
Figure 2:
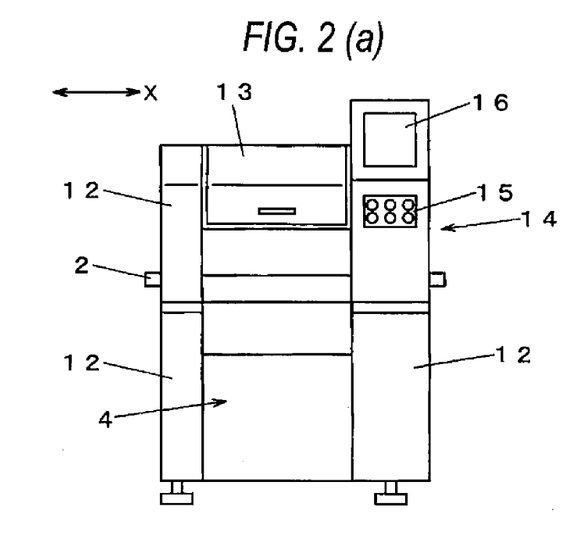
FIG. 2 is a drawing to show cover replacement of the electronic component mounting apparatus of the embodiment of the invention.
Figure 3:
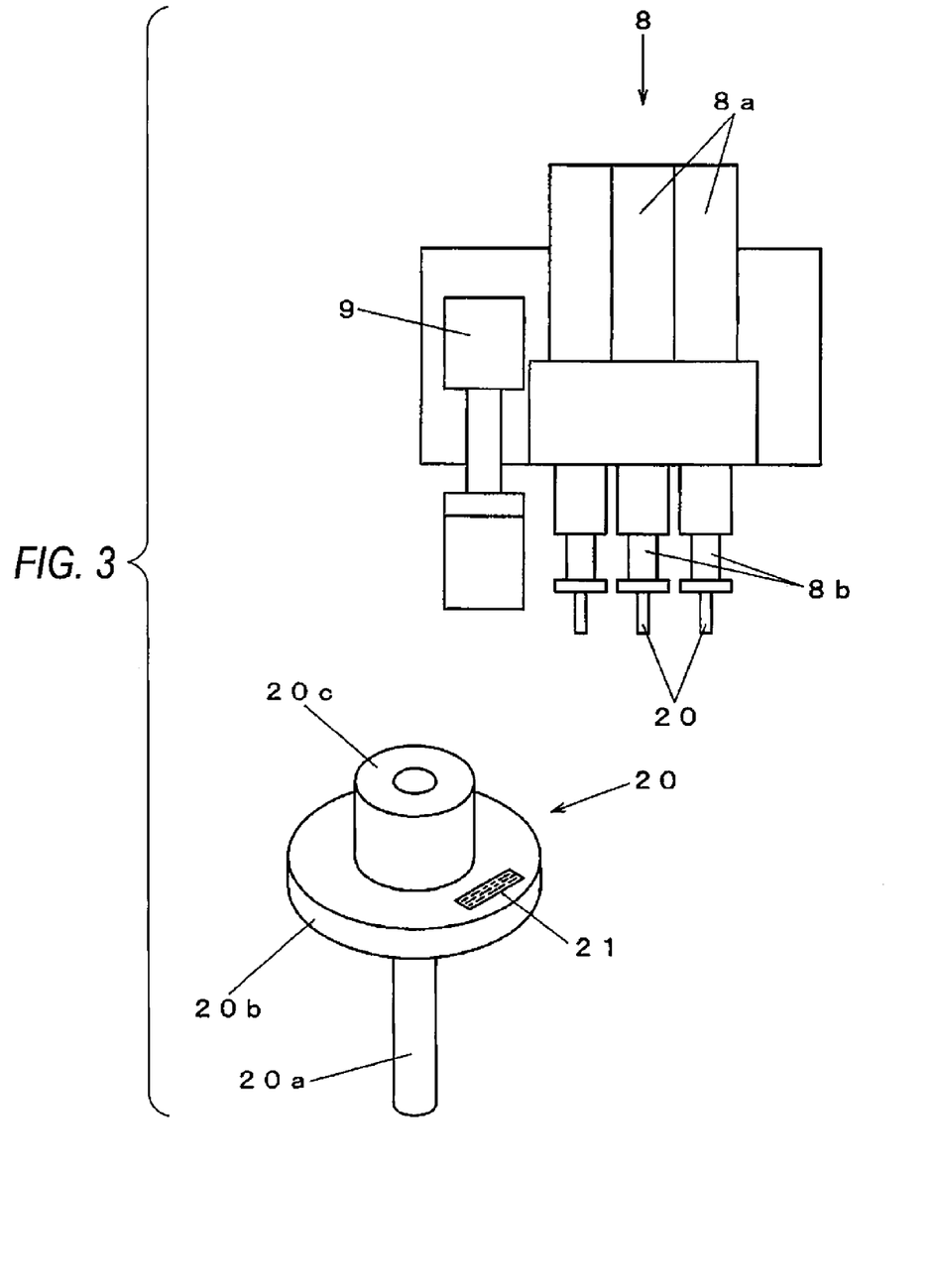
FIG. 3 is a drawing to show the configuration of a mount head of the electronic component mounting apparatus of the embodiment of the invention.
Figure 4:
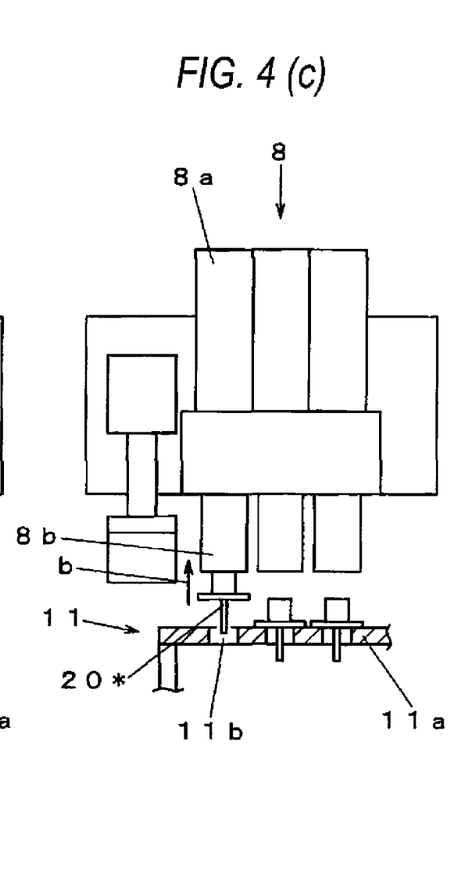
FIG. 4 is a schematic representation of the read operation of the identification information of an adsorption nozzle in the electronic component mounting apparatus of the embodiment of the invention.
Figure 5:
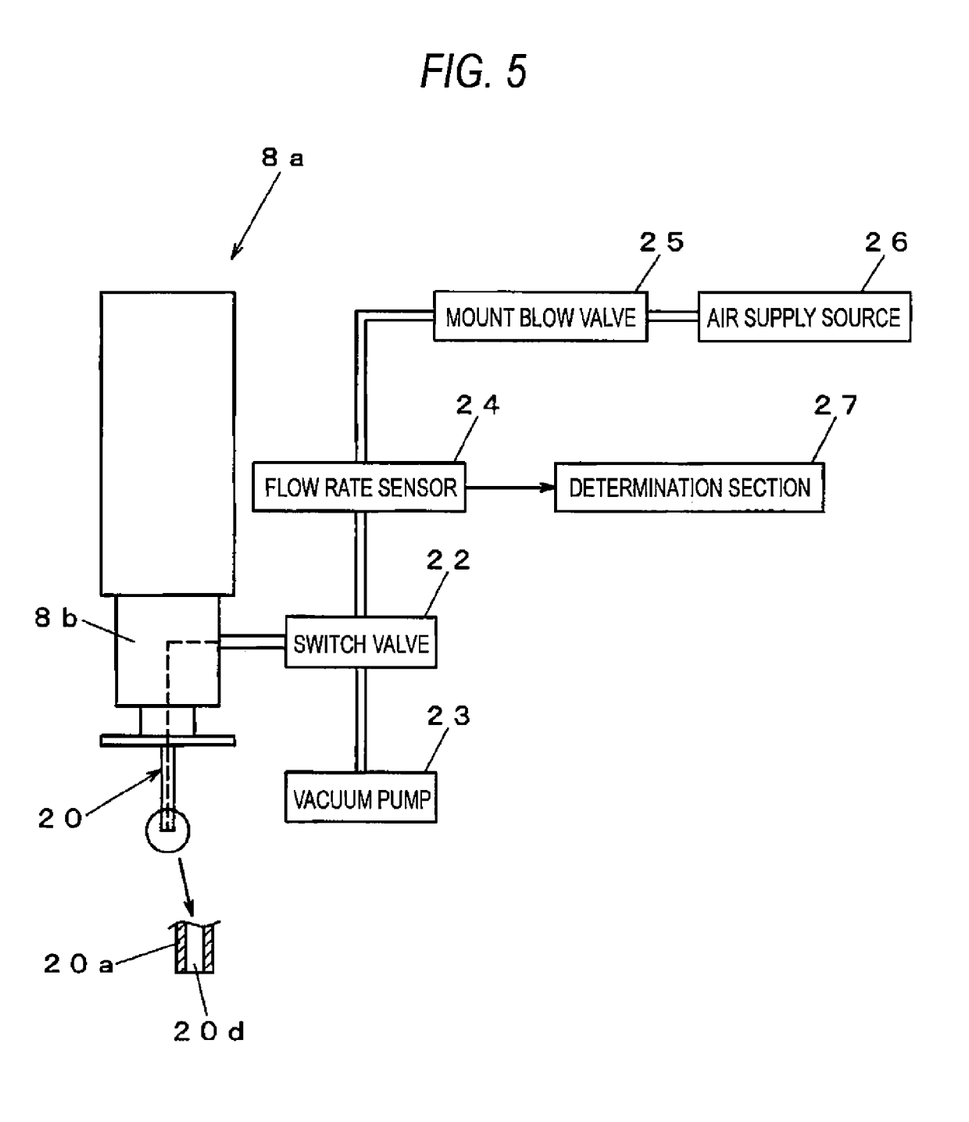
FIG. 5 is a block diagram to show the configuration of a vacuum suction and air blow circuit of the electronic component mounting apparatus of the embodiment of the invention.
Figure 6:
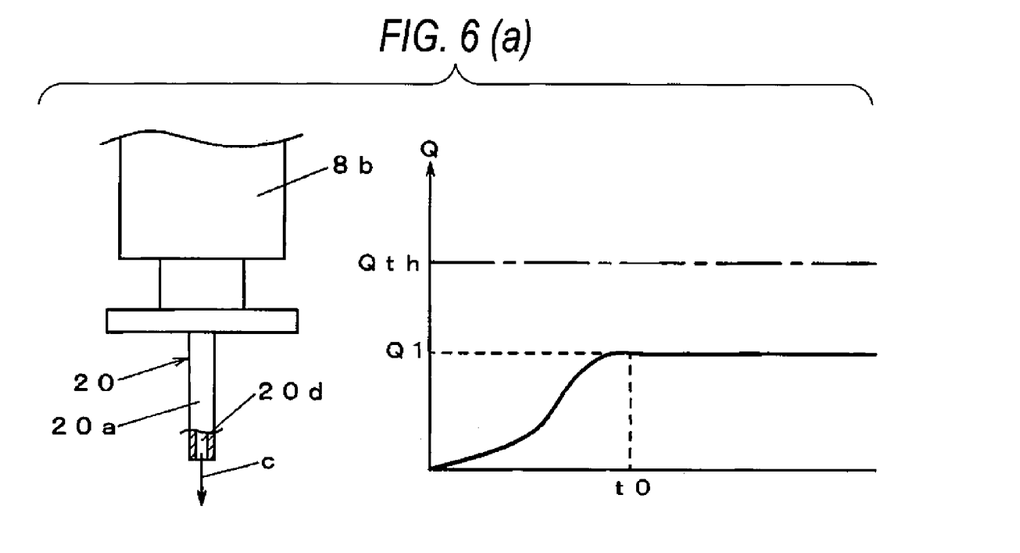
FIG. 6 is a schematic representation of detection of presence or absence of placing of an adsorption nozzle in the electronic component mounting apparatus of the embodiment of the invention.
Figure 7:
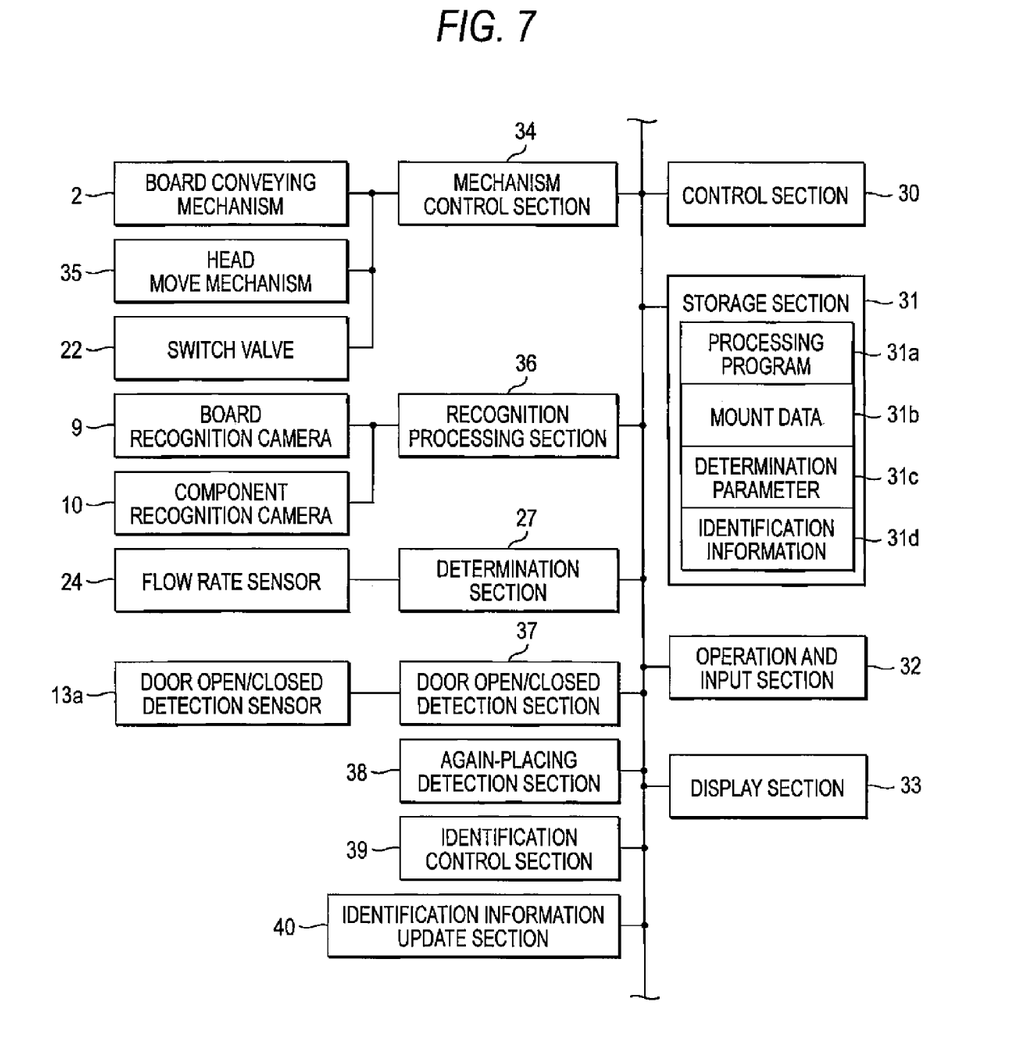
FIG. 7 is a block diagram to show the configuration of a control system of the electronic component mounting apparatus of the embodiment of the invention.
Figure 8:
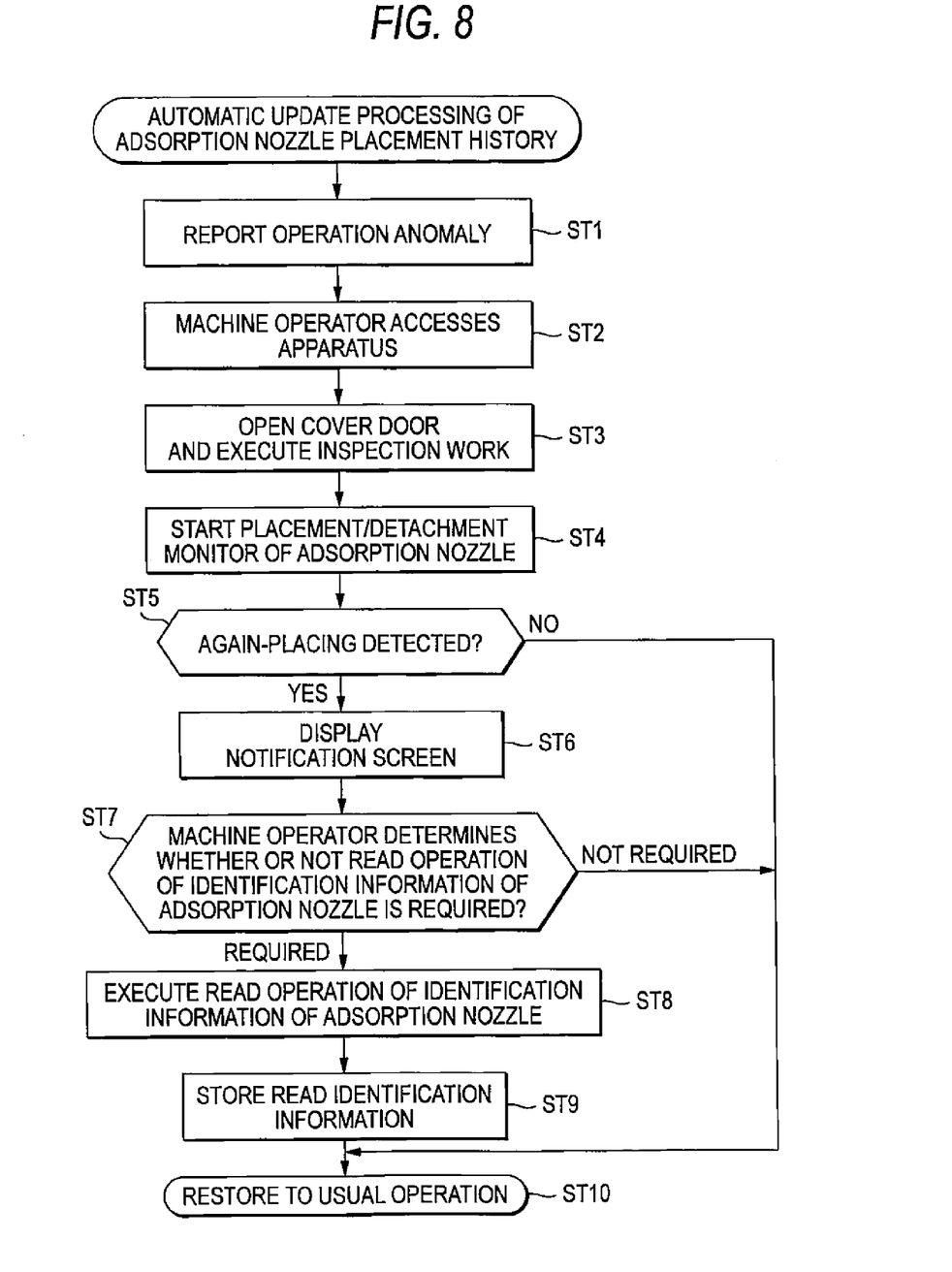
FIG. 8 is a flowchart to show automatic update processing of an adsorption nozzle placement history in the electronic component mounting apparatus of the embodiment of the invention.
Figure 9:
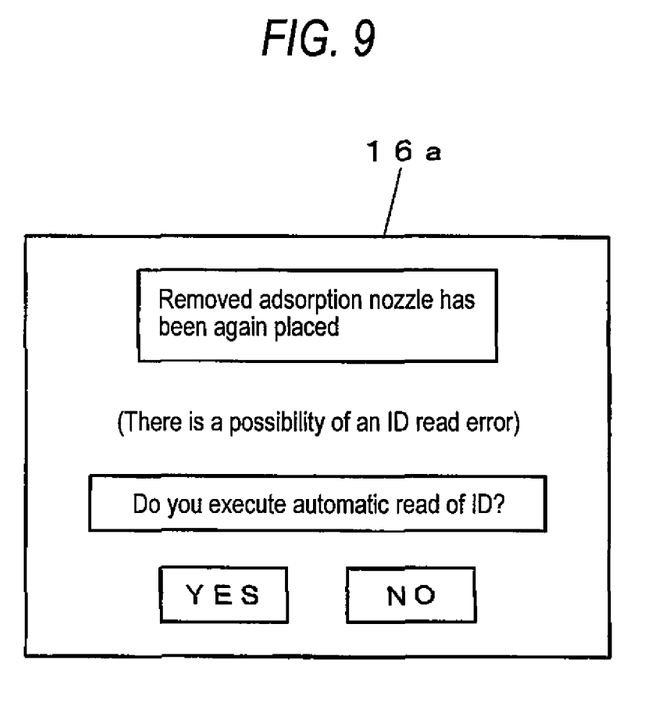
FIG. 9 is a drawing to show a display screen in the electronic component mounting apparatus of the embodiment of the invention.

Next, an embodiment of the invention will be discussed with reference to the accompanying drawings. FIG. 1 is a plan view of an electronic component mounting apparatus of one embodiment of the invention, FIG. 2 is a drawing to show cover replacement of the electronic component mounting apparatus of the embodiment of the invention, FIG. 3 is a drawing to show the configuration of a mount head of the electronic component mounting apparatus of the embodiment of the invention, FIG. 4 is a schematic representation of the read operation of the identification information of an adsorption nozzle in the electronic component mounting apparatus of the embodiment of the invention, FIG. 5 is a block diagram to show the configuration of a vacuum suction and air blow circuit of the electronic component mounting apparatus of the embodiment of the invention, FIG. 6 is a schematic representation of detection of presence or absence of placing of an adsorption nozzle in the electronic component mounting apparatus of the embodiment of the invention, FIG. 7 is a block diagram to show the configuration of a control system of the electronic component mounting apparatus of the embodiment of the invention, FIG. 8 is a flowchart to show automatic update processing of an adsorption nozzle placement history in the electronic component mounting apparatus of the embodiment of the invention, and FIG. 9 is a drawing to show a display screen in the electronic component mounting apparatus of the embodiment of the invention.

First, the structure of the electronic component mounting apparatus will be discussed with reference to FIG. 1. In FIG. 1, a board conveying mechanism 2 is disposed in an X direction in the center of a base 1. The board conveying mechanism 2 conveys a board 3 and positions the board 3 on a component mount stage set in the board conveying mechanism 2. A component supply section 4 is placed on both sides of the board conveying mechanism 2 and a plurality of tape feeders 5 are placed side by side in each of the component supply sections 4. The tape feeder 5 stores an electronic component held on tape and executes pitch feed of the tape, thereby supplying the electronic component to a pickup position with a mount head described below.

Y axis tables 6A and 6B are displaced on both ends of the top face of the base 1 and two X axis tables 7A and 7B are placed on the Y axis tables 6A and 6B. The Y axis table 6A is driven, whereby the X axis table 7A horizontally moves in the Y direction. The Y axis table 6B is driven, whereby the X axis table 7B horizontally moves in the Y direction. A mount head 8 and a board recognition camera 9 moving integrally with the mount head 8 are placed on each of the X axis tables 7A and 7B. The board recognition camera 9 moving onto the board 3 and picks up an image of the board 3 and recognizes the board 3. A recognition processing section 36 (see FIG. 7) performs recognition processing of the image pickup result, thereby performing position recognition of the board 3.

The Y axis table 6A, the X axis table 7A, the Y axis table 6B, and the X axis table 7B are driven in combination, the mount head 8 horizontally moves and an adsorption nozzle 20 (see FIG. 3) detachably placed the mount head 8 picks up an electronic component from each of the component supply sections 4 by vacuum adsorption and mounts the electronic components on the board 3 positioned on the component mount stage of the board conveying mechanism 2. The Y axis table 6A, the X axis table 7A, the Y axis table 6B, and the X axis table 7B make up a head move mechanism (see a head move mechanism 35 shown in FIG. 7) for moving the mount head 8 together with the board recognition camera 9 in one body.

A component recognition camera 10 and a nozzle stocker 11 are disposed in a path from the component supply section 4 to the board conveying mechanism 2. The nozzle stocker 11 stores and holds the adsorption nozzles 20 corresponding to different types of electronic components and the mount head 8 accesses the nozzle stocker 11 and performs nozzle placing operation, thereby placing the adsorption nozzle 20 stored in the nozzle stocker 11 on the mount head 8. If the mount head 8 with the adsorption nozzle 20 already placed thereon is made to access the nozzle stocker 11, nozzle detaching operation of removing the already placed adsorption nozzle 20 and then nozzle placing operation is performed, whereby the already placed adsorption nozzle 20 can be replaced with another adsorption nozzle 20.

Each of the component recognition cameras 10 picks up an image of the electronic component held on the mount head 8 from below. The recognition processing section 36 (see FIG. 7) performs recognition processing of the image pickup result, whereby the electronic component held on the adsorption nozzle 20 can be recognized. Accordingly, the attitude of the electronic component held on the adsorption nozzle 20 can be inspected. That is, the XY direction of the electronic component relative to the adsorption nozzle 20 and a position shift in the rotation direction are detected. When the electronic component is moved to and mounted on the board 3 by the mount head 8, the attitude of the electronic component is corrected based on the inspection result and the electronic component is mounted on the board.

FIG. 2 is an external view of the electronic component mounting apparatus and shows cover replacement. As shown in FIG. 2 (a), in the electronic component mounting apparatus, fixed cover members 12 close the operation range of the mount head 8 except in the range of the portion corresponding to the component supply section 4 and the cover door 13 provided for accessing the inside of the apparatus. The board conveying mechanism 2 projects horizontally through conveying openings provided in the cover members 12 on both sides in the X direction.

An operation section 14 for a machine operator to operate the apparatus is provided on one side of the cover door 13, and an operation panel 15 and a display panel 16 are placed on the operation section 14. The operation panel 15 is provided with operation buttons and input keys and the machine operator enters operation commands and various pieces of data for operating the apparatus by operating the operation buttons and the input keys. The display panel 16 is a display of a liquid crystal panel, etc., and displays a guide screen at the operation input time and a notification screen of an operation anomaly, etc.

As shown in FIG. 2 (b), the cover door 13 can be opened and closed up and down and when the cover door 13 is opened, a work opening 12a not closed by the cover member 12 is ensured on a side of the apparatus, whereby it is made possible for the machine operator to perform inspection and maintenance work of the apparatus inside through the work opening 12a. A door open/closed detection sensor 13a for detecting the open/closed state of the cover door 13 is provided in the work opening 12a; when the cover door 13 is turned upward and is opened, the door open/closed detection sensor 13a outputs a signal indicating that the cover door 13 is open to a door open/closed detection section 37 (see FIG. 7). The door open/closed detection sensor 13a and the door open/closed detection section 37 make up the cover door 13 for closing the operation range of the mount head 8 and open/closed detection means for detecting that the cover door 13 is open or closed.

Next, the mount head 8 will be discussed with reference to FIG. 3. As shown in FIG. 3, the mount head 8 is multi-type and includes a plurality of unit mount heads 8a. Each of the unit mount heads 8a includes the adsorption nozzle 20 for adsorbing and holding an electronic component in a lower end part; the unit mount heads 8a cab be moved up and down individually. The adsorption nozzle 20 is detachably placed in a nozzle placement part 8b provided in a lower part of the unit mount head 8a in response to the type of electronic component.

The adsorption nozzle 20 is provided with a disk-like flange part 20b in a lower part of a fit part 20c of a shape fitted into a placement hole (see a placement hole 8c shown in FIG. 6 (b)) provided in the nozzle placement part 8b and has a nozzle shaft 20a extended downward from the flange part 20b. The lower face of the flange part 20b has a function of downward reflecting illumination light applied from below at the image picking up time of the component recognition camera 10. An adsorption hole 20d (see FIG. 5) is opened in a lower end part of the nozzle shaft 20a and an electronic part is adsorbed and held on the lower end face of the nozzle shaft 20a by vacuum suction from the adsorption hole.

A two-dimensional bar code label 21 is put on the top face of the flange part 20b and identification information for identifying the adsorption nozzle 20 is applied to the two-dimensional bar code label 21. When the adsorption nozzle 20 is placed on each unit mount head 8a of the mount head 8, the board recognition camera 9 previously picks up an image of the adsorption nozzle 20 from above in the nozzle stocker 11. The recognition processing section 36 (see FIG. 7) recognizes an image of the two-dimensional bar code label 21 read by picking up the image of the adsorption nozzle 20, thereby reading the identification information of the adsorption nozzle 20.

That is, the bar code applied to the two-dimensional bar code label 21 on the upper face of the adsorption nozzle 20 is used as means for giving identification information, and the board recognition camera 9 provided integrally with the mount head 8 is an identification information read section for reading the identification information given to the adsorption nozzle. This identification information is used to check tool correctness or incorrectness as to whether or not the adsorption nozzle 20 is a nozzle of appropriate type corresponding to the component type to execute and the read identification information is stored as nozzle placement history data, whereby it is made possible to ensure traceability on quality control. As means for applying the identification information, the adsorption nozzle 20 may be provided with an RF tag and the mount head 8 may be provided with a reader/writer for writing and reading data to and from the RF tag as an identification information read section. Identification information of a two-dimensional bar code, etc., may be put on the upper face of the adsorption nozzle 20.

Next, the operation of moving the mount head 8 to the nozzle stocker 11 and placing the adsorption nozzle 20 on the unit mount head 8a will be discussed with reference to FIG. 4. The nozzle stocker 11 includes a placement table 11a for placing the adsorption nozzles 20 and the placement table 11a is provided with storage holes 11b to store the adsorption nozzles 20 corresponding to the arrangement pitches of the unit mount heads 8a in the mount head 8. Here, an operation example of the case where a new adsorption nozzle 20 is placed on the unit mount head 8a where no adsorption nozzle 20 is placed is shown.

First, as shown in FIG. 4 (a), the mount head 8 is moved to above the nozzle stocker 11 and the board recognition camera 9 is positioned above an adsorption nozzle 20* to be placed. In this state, the board recognition camera 9 picks up an image of the adsorption nozzle 20*, whereby the image of the two-dimensional bar code label 21 previously put on the top face of the flange part 20b shown in FIG. 3 is read. The recognition processing section 36 performs recognition processing of the image data, whereby the identification information of the adsorption nozzle 20* can be read.

Then, as shown in FIG. 4 (b), the mount head 8 is moved and the unit mount head 8a to place the adsorption nozzle is positioned above the adsorption nozzle 20* whose identification has already been read, and is made to execute nozzle placing operation. Accordingly, the nozzle placement part 8b moves down (arrow a), the fit part 20c is fitted into the placement hole 8c, and the nozzle placement is complete. Then, as shown in FIG. 4 (c), the nozzle placement part 8b moves up (arrow b), whereby the placement processing of the adsorption nozzle 20 in the unit mount head 8a is complete. Thus, whenever the adsorption nozzle 20 is placed in each of the unit mount heads 8a making up the mount head 8, the board recognition camera 9 picks up the two-dimensional bar code label 21, whereby the above-mentioned tool correctness or incorrectness can be performed reliably and nozzle placement history data can be acquired.

To place a plurality of adsorption nozzles 20 in the unit mount heads 8a at the same time, before the nozzle placing operation, first the board recognition camera 9 may pick up images of a plurality of adsorption nozzles 20 to be placed in sequence for previously reading the two-dimensional bar code label 21 and then the placing operation of the adsorption nozzles 20 in the unit mount heads 8a may be executed. In FIG. 4, the operation example in placing a new adsorption nozzle 20 on the unit mount head 8a where no adsorption nozzle is placed is shown; however, the board recognition camera 9 also reads the two-dimensional bar code label 21 in a similar manner in the nozzle replacing operation of replacing an already placed adsorption nozzle 20 with another type of adsorption nozzle 20 in the unit mount head 8a where the adsorption nozzle 20 is already placed. In this case, the already placed adsorption nozzle 20 is detached from the nozzle placement part 8b and is placed on the placement table 11a and then the operation shown in FIG. 4 is executed.

Next, the configuration of a vacuum suction and air blow circuit for executing vacuum suction from the adsorption nozzle 20 and ejecting positive pressure air from the adsorption nozzle 20 will be discussed with reference to FIG. 5. As shown in FIG. 5, a switch valve 22 of a three-way valve is connected to the nozzle placement part 8b where the adsorption nozzle 20 is placed in the unit mount head 8a. A vacuum pump 23 of vacuum suction means is connected to one port of the switch valve 22 and a mount blow valve 25 of an on/off valve is connected to an opposite port through a flow rate sensor 24. The switch valve 22 is switch means for selectively connecting the vacuum suction means and air blow means described later to the adsorption nozzle 20.

The vacuum pump 23 and the switch valve 22 is switched to the side of the vacuum pump 23 in a state in which the adsorption nozzle 20 is placed in the nozzle placement part 8b, whereby the adsorption nozzle 20 is connected to the vacuum pump 23 and accordingly, vacuum suction is performed from the adsorption hole 20d provided in the nozzle shaft 20a of the adsorption nozzle 20. The circuit from the adsorption nozzle 20 to the vacuum pump 23 is a vacuum suction circuit where air flows at the vacuum suction time.

The mount blow valve 25 is connected to an air supply source 26 and the switch valve 22 is switched to the side of the mount blow valve 25, whereby the adsorption nozzle 20 is connected to the air supply source 26 through the mount blow valve 25. In this state, the mount blow valve 25 is opened, whereby positive pressure air supplied from the air supply source 26 is ejected from the adsorption hole 20d of the adsorption nozzle 20. The air blow operation is performed for placing the electronic component adsorbed and held by the adsorption nozzle 20 at a mount point of the board 3 and then detaching the electronic component from the adsorption nozzle 20 (nozzle vacuum destruction) and blowing out foreign substances in the adsorption hole 20d for cleaning (nozzle cleaning blow). The air supply source 26 is air blow means for ejecting positive pressure air from the adsorption nozzle 20 and the circuit from the air supply source 26 to the adsorption nozzle 20 is an air blow circuit where positive pressure air flows at the air blowing time. The flow rate sensor 24 may be placed between the nozzle placement part 8b and the switch valve 22. In so doing, the flow rate on the suction side can also be measured with the single flow rate sensor 24 and thus it is desirable.

In the embodiment, if it is necessary to detect the presence or absence of the adsorption nozzle 20 in the mount head 8, a nozzle presence/absence detection method using the above-described configuration is used. That is, while the air blow means is driven and positive pressure air is ejected, the flow rate sensor 24 measures the flow rate of air flowing through the air blow circuit and the presence or absence of the adsorption nozzle 20 in the mount head 8 is determined based on the flow rate measurement result of the flow rate sensor 24.

In the nozzle presence/absence detection, the flow rate sensor 24 intervened in the air blow circuit detecting the temperature difference between fluids flowing inside, thereby measuring the flow rate of the positive pressure air flowing through the air blow circuit per unit time by air blow as a flow rate pattern indicating variation with time (see FIG. 6). The flow rate measurement result of the flow rate sensor 24 is sent to a determination section 27. The determination section 27 compares the flow rate measurement result with a determination parameter 31c stored in a storage section 31, thereby determining whether or not the adsorption nozzle 20 is placed in each of the unit mount heads 8a of the mount head 8 and detecting the presence or absence of the adsorption nozzle 20. That is, the determination section 27 determines the presence or absence of the adsorption nozzle 20 in each of the unit mount heads 8a of the mount head 8 based on the flow rate measurement result of the flow rate sensor 24. At the nozzle present/absence detecting time, if air blow at the nozzle cleaning blowing time is used, pressure is higher than that at the nozzle vacuum destruction time and thus more stable detection can be made and thus it is desirable.

FIG. 6 shows a determination example of the presence or absence of the adsorption nozzle 20. FIG. 6 (a) shows a state in which the air blow operation is performed in a state in which the adsorption nozzle 20 is placed in the nozzle placement part 8b in the unit mount head 8a. In this case, positive pressure air by the air blow is ejected from the adsorption hole 20d provided in the nozzle shaft 20a (arrow c) and thus the ejection flow rate is limited by the hole diameter of the adsorption hole 20d and the flow rate measurement value of the flow rate sensor 24 after a predetermined time t0 has elapsed since the air blow start and a stationary ejection state has been entered converges to a predetermined first flow rate value Q1 responsive to the hole diameter. In nozzle presence/absence detection, if the flow rate measurement value after the predetermined time t0 has elapsed falls below a threshold value Qth set allowing for a proper margin relative to the first flow rate value Q1, "nozzle presence" is determined. The threshold value Qth is set to a sufficiently smaller value than a flow rate measurement value (second flow rate value Q2) in a state of "nozzle absence" shown below.

FIG. 6 (b) shows change in the flow rate measurement value of the flow rate sensor 24 when the adsorption nozzle 20 is once removed from the nozzle placement part 8b (arrow d) from the nozzle placement state shown in FIG. 6 (a) and then is again placed in the nozzle placement part 8b (arrow f). The flow rate measurement value in the state in which the adsorption nozzle 20 is placed is the first flow rate value Q1 shown in FIG. 6 (a) and from the state, the adsorption nozzle 20 is removed, whereby the placement hole 8c of the nozzle placement part 8b is opened and the positive pressure air by the air blow is ejected directly to the outer air through the placement hole 8c (arrow e). Therefore, the flow rate measurement value of the flow rate sensor 24 rises rapidly from a timing t1 at which the adsorption nozzle 20 is removed, and converges to the second flow rate value Q2 exceeding the threshold value Qth.

If the adsorption nozzle 20 is again placed from the state, the flow rate measurement value of the flow rate sensor 24 falls rapidly from a timing t2 at which the fit part 20c is fitted into the placement hole 8c, and again converges to the first flow rate value Q1. The flow rate measurement value is increased or decreased because of the presence or absence of the adsorption nozzle 20; the flow rate measurement value of the flow rate sensor 24 is monitored during execution of the air blow operation, whereby the presence or absence of the adsorption nozzle 20 in the unit mount head 8a and again placing of the adsorption nozzle 20 after once removing the adsorption nozzle 20 can be detected.

Next, the configuration of a control system will be discussed with reference to FIG. 7. A control section 30 is a CPU and executes a processing program stored in the storage section 31, thereby controlling sections described below. In the control processing, data stored in the storage section 31 is referenced. The storage section 31 stores a processing program 31a, mount data 31b, the determination parameter 31c, and identification information 31d. The processing program 31a is a program required for executing operation and computation of the sections described below. The mount data 31b is data used in the mount operation of mounting electronic components on the board 3, such as component data and mount coordinate data.

The determination parameter 31c is threshold value data used to determine the presence or absence of the adsorption nozzle 20 in the mount head 8 based on the flow rate measurement result of the flow rate sensor 24. The identification information 31d is identification information read as the board recognition camera 9 of an identification information read section reads the two-dimensional bar code label 21 put on the adsorption nozzle 20; the information is used as tool correctness or incorrectness check and nozzle mount history data as described above. Therefore, the storage section 31 is an identification information storage section for storing the identification information read by the identification information read section as the mount history data of the adsorption nozzle 20 in the mount head 8.

An operation and input section 32 performs processing for an operation command and data input according to a signal input by button operation and ten key operation of the operation panel 15 provided in the operation section 14 and an input signal from a touch panel switch set on a screen of the display panel 16. A display section 33 performs processing for displaying various screens such as a guide screen at the operating time through the operation panel 15 on the display panel 16 provided adjacent to the operation panel 15.

A mechanism control section 34 controls the operation of the head move mechanism 35 for moving the board conveying mechanism 2 and the mount head 8 together with the board recognition camera 9 in one body and the switch valve 22. Accordingly, the board recognition camera 9 can be moved to the nozzle stocker 11 and an image of any of the adsorption nozzles 20 can be picked up and the two-dimensional bar code label 21 can be read. The recognition processing section 36 performs recognition processing of the image pickup result of the board recognition camera 9 and the component recognition camera 10. Accordingly, the position of the board 3 and the position of the electronic component held on the mount head 8 are recognized and the two-dimensional bar code label 21 applied to the adsorption nozzles 20 is read.

The determination section 27 compares the flow rate measurement result of the flow rate sensor 24 with the determination parameter 31c stored in the storage section 31 and executes predetermined determination processing, thereby performing processing of detecting the presence or absence of the adsorption nozzle 20 in the mount head 8. Therefore, the flow rate sensor 24 and the determination section 27 are a nozzle presence/absence detection section for detecting the presence or absence of the adsorption nozzle 20 in the mount head 8.

As the nozzle presence/absence detection section, in addition to configuration shown in the embodiment, various configurations can be adopted; for example, instead of measuring the flow rate of the air blow circuit by the flow rate sensor 24, a flow rate sensor similar to the flow rate sensor 24 may be intervened in the vacuum suction circuit for executing vacuum suction from the vacuum pump 23 and the presence or absence of the adsorption nozzle 20 may be detected based on the flow rate measurement result. In this case, the fact that the vacuum suction flow rate fluctuates according to the presence or absence of the adsorption nozzle 20 is used. The vacuum pump 23 may be operated and the vacuum degree in the vacuum suction circuit when vacuum suction is executed from the adsorption nozzle 20 may be measured and the presence or absence of the adsorption nozzle 20 may be detected based on the measurement result. In this case, the fact that the ultimate vacuum varies depending on the presence or absence of the adsorption nozzle 20 is used. Further, the presence of the adsorption nozzle 20 may be directly detected by an optical sensor.

However, to use the measurement result of the vacuum suction flow rate or the ultimate vacuum as the configuration of detection of the nozzle presence or absence, it is also considered that the following disadvantage occurs: In the methods, since it is assumed that vacuum suction is executed from the vacuum suction circuit, suction of a minute foreign substance into the vacuum suction circuit through the adsorption nozzle cannot be circumvented and it is feared that the sucked substances may accumulate, resulting in early clogging of a filter placed in the vacuum suction circuit. If it is necessary to replace the adsorption nozzle in such a monitor time, a suction force acts on the nozzle and thus a large force is required for detaching the adsorption nozzle from the mount head. In contrast, the method of detecting the nozzle presence or absence based on the flow rate measurement result at the air blowing time as shown in the embodiment is adopted, whereby if the detection function is operated continuously for a long time in the apparatus operating state and nozzle presence or absence is monitored at all times, the disadvantage inevitably occurring accompanying the vacuum suction operation as described above can also be excluded.

The door open/closed detection section 37 detects whether or not the cover door 13 is opened in the electronic component mounting apparatus based on an output signal of the door open/closed detection sensor 13a. An again-placing detection section 38 performs processing of detecting that adsorption nozzle is again placed by a machine operator after adsorption nozzle is once removed based on the open/closed detection result of the cover door by the door open/closed detection section 37 and the determination result of the determination section 27. When the door open/closed detection section 37 detects that the cover door 13 is opened, the again-placing detection section 38 switches the switch valve 22 to the air blow side for opening the mount blow valve 25, and operates the air supply source 26 for ejecting positive pressure air from the adsorption nozzle 20. In this state, the determination section 27 monitors the flow rate measurement value of the flow rate sensor 24, whereby again-placing detection processing of the adsorption nozzle 20 shown in FIG. 6 (b) is executed.

That is, the again-placing detection section 38 continuously executes nozzle presence/absence detection processing with an open/closed detection signal of the cover door 13 as a trigger and if "nozzle presence"—"nozzle absence"—

"nozzle presence" are detected in order during the cover door open time, the again-placing detection section 38 assumes that adsorption nozzle 20 is again placed after adsorption nozzle is once removed by a machine operator, and provides notification. In other words, the again-placing detection section 38 detects in an estimated manner that the adsorption nozzle is once removed and then is again placed by a machine operator by combining the open/closed detection result of the cover door by the door open/closed detection means and the nozzle presence/absence detection result. An identification control section 39 executes processing of causing the identification information read section to perform the read operation of the identification information based on the detection result of the again-placing detection section 38. An identification information update section 40 executes processing of writing new read identification information into the identification information storage section and updating the mount history data.

When the electronic component mounting apparatus is moved, operation anomalies caused by various factors occur and are detected by sensors provided in the sections of the apparatus and a monitor program previously built in an operation program and the machine operator is notified of the operation anomaly. In such a case, the machine operator accesses the apparatus and performs inspection and takes measures to eliminate the reported anomaly.

At this time, if it seems that the anomaly occurrence state relates to the adsorption nozzle 20, the machine operator opens the cover door 13 and inspects the inside and depending on the situation, removes the adsorption nozzle 20 by manual operation and observes abrasion, clogging state, etc., of the nozzle adsorption face. If a nozzle failure is determined, the adsorption nozzle 20 is replaced with a new adsorption nozzle 20 of the same type. In such a case, the nozzle history data of the adsorption nozzle 20 determined a failure remains stored in the storage section 31, and the fact that nozzle replacement is executed is not reflected on the nozzle history data.

To prevent such a situation, in the embodiment, automatic update processing of the adsorption nozzle placement history as shown in FIG. 8 is performed. This processing indicates a nozzle placement history data management method of managing the placement history data of the adsorption nozzle 20 in the mount head 8.

In FIG. 8, when the machine operator is notified of an operation anomaly during operation of the electronic component mounting apparatus (ST1), the machine operator accesses the apparatus (ST2). At this time, the machine operator opens the cover door 13 and executes inspection work of the inside of the apparatus according to the reported anomaly description (ST3). In the inspection work, if the anomaly description relates to the adsorption nozzle 20, the machine operator removes the abnormal adsorption nozzle 20 placed on the unit mount head 8a by manual operation and checks the state. If the anomaly can be repaired by rework, such as clogging caused by a foreign substance according to the check result, the machine operator executes necessary recovery measures and then again places the adsorption nozzle 20 as it is. In contrast, if the machine operator determines that the state is an un-repairable state such as nozzle end part abrasion, the machine operator performs nozzle replacement work of placing a new adsorption nozzle 20 of the same type.

In the process of executing the inspection work, the again-placing detection section 38 monitors the presence or absence of again-placing of adsorption nozzle 20. That is, the door open/closed detection section 37 detects that the cover door 13 is opened, placement/detachment monitor of adsorption nozzle 20 by the determination section 27 is started (ST4).

The placement/detachment monitor is performed as the determination section 27 of a nozzle presence/absence detection section detects the presence or absence of adsorption nozzle 20 based on the flow rate measurement result of the flow rate sensor 24.

In the placement/detachment monitor, if the again-placing detection section 38 detects again-placing of adsorption nozzle 20, namely, detects, based on the detection result of the nozzle presence/absence detection section, that adsorption nozzle 20 is again placed by the machine operator after adsorption nozzle 20 is once removed by combining the open/closed detection result of the cover door 13 and the nozzle presence/absence detection result, the display section 33 displays a notification screen for reporting again-placing detection on the display panel 16 (ST5).

That is, as shown in FIG. 9, a display screen 16a of the display panel 16 displays a warning to the effect that the once removed adsorption nozzle 20 is again placed and there is a possibility of an ID (identification information) read error and also displays a message of prompting the machine operator to enter execution or no execution of automatic read of ID (YES or NO) (ST6) and the machine operator determines whether or not the read operation of the identification information of the adsorption nozzle 20 is required in response to the situation (ST7).

If again-placing is not detected at (ST5) or if the machine operator determines that the read operation is not required and selects NO on the display screen 16a at (ST7), the apparatus is restored to usual operation (ST10). The case where NO is selected is such a case where although the adsorption nozzle is again placed in the inspection work, the already placed adsorption nozzle is again placed only as it is and nozzle replacement is not executed. In this case, the machine operator executing the work knows the fact and therefore determines that the ID read operation is not required.

In contrast, if nozzle replacement is executed in the inspection work, the machine operator determines that the read operation of identification information of a new adsorption nozzle 20 is required and selects YES on the display screen 16a at (ST7). The command input is transmitted to the identification control section 39 and the read operation of the identification information of the adsorption nozzle 20 shown in FIG. 4 is executed (ST8).

That is, the mount head 8 is moved onto the nozzle stocker 11 and the adsorption nozzle 20 whose again-placing has been detected, placed on the unit mount head 8a is once placed on the placement table 11a of the nozzle stocker 11. Next, the board recognition camera 9 provided integrally with the mount head 8 picks up an image of the adsorption nozzle 20 and reads the two-dimensional bar code label 21. Then, the adsorption nozzle 20 is again placed on the unit mount head 8a. Further, then, the identification information update section 40 writes the read identification information into the storage section 31 (ST9), thereby updating the identification information 31d.

In the processing described above, if again-placing of the adsorption nozzle 20 is detected, the board recognition camera 9 of the identification information read section is caused to perform the read operation of the two-dimensional bar code label 21 and the newly read identification information 31d is written into the storage section 31 as the identification information storage section for update. In the processing described above, the display panel 16 and the display section 33 function as display means for displaying the detection result of the again-placing detection section 38. The operation panel 15 and the operation and input section 32 function as input means for the machine operator to indicate whether or not the identification information read operation is required for the identification control section 39 upon reception of the displayed detection result.

In the embodiment, the machine operator receiving the displayed detection result determines whether or not the identification information read operation is required, and causes the identification information read section to perform the identification information read operation. The automatic update processing of the adsorption nozzle placement history is executed, whereby the nozzle placement history data can be correctly managed and data reliability can be ensured. If automatic update of the adsorption nozzle placement history is not performed, when the machine operator again places adsorption nozzle by manual operation, it is made possible to perform the identification information read operation as required based on the detection result of the again-placing detection section 38. Likewise, the nozzle placement history data can be correctly updated and managed and data reliability can be ensured.

To completely eliminate mistakes of the nozzle placement history data caused by a human error of the machine operator, steps (ST6) and (ST7) in FIG. 8 may be skipped. In this case, if again-placing of the adsorption nozzle 20 is detected at (ST5), unconditionally the process goes to (ST8) and the identification information read operation is executed independently of the determination of the machine operator. Accordingly, if the adsorption nozzle 20 is again placed, the two-dimensional bar code label 21 of the adsorption nozzle 20 is always read and the correct nozzle placement history is always recorded without the intervention of a human error and it is made possible to ensure traceability with high reliability.

In the embodiment, the door open/closed detection signal indicating that the cover door 13 is opened is used as a trigger signal for starting again-placing detection by the again-placing detection section 38 by way of example, but any other signal than the door open/closed detection signal may be used if the signal is a signal indicating some operation performed by the machine operator. For example, if there is provided a safety securing sensor for detecting that a part of the body such as an upper limb of the machine operator enters a gap space in the proximity of the tape feeder 5 in the component supply section 4, a detection signal of the sensor may be used as a trigger for starting again-placing detection by the again-placing detection section 38. Further, if the component mount function of the electronic component mounting apparatus stops, the air blowing operation is continued at all times and the flow rate sensor 24 and the determination section 27 are made to function and again-placing detection by the again-placing detection section 38 may always be executed.

While the embodiment of the invention has been described, it is to be understood that the invention is not limited to the items shown in the embodiments described above and the invention is also intended for those skilled in the art to make modifications and application based on the Description of the invention and well-known arts and the modifications and the application are contained in the scope to seek protection.

This application is based on Japanese Patent Application (No. 2007-291488) filed on Nov. 9, 2007, which is incorporated herein by reference.

INDUSTRIAL APPLICABILITY

The electronic component mounting apparatus and the nozzle placement history data management method of the invention have the advantages that the nozzle placement history data can be correctly updated and managed and data reliability can be ensured, and can be used in the electronic component mounting field of mounting electronic components on a board by adsorption and holding.

The invention claimed is:

1. A nozzle placement history data management method of managing placement history data of an adsorption nozzle in a mount head, the method used in an electronic component mounting apparatus for picking up an electronic component by vacuum adsorption from a component supply section with the adsorption nozzle detachably placed on the mount head and mounting the electronic component on a board, wherein:

the electronic component mounting apparatus comprises an identification information read section for reading identification information given to the adsorption nozzle, an identification information storage section for storing the read identification information, and a nozzle presence/absence detection section for detecting the presence or absence of the adsorption nozzle in the mount head, and the nozzle placement history data management method comprises detecting that the adsorption nozzle is once removed and then is again placed by a machine operator based on the detection result of the nozzle presence/absence detection section, wherein if again-placing of the nozzle is detected, the identification information read section is caused to perform read operation of the identification information and newly read identification information is written into the identification information storage section for update.

2. The nozzle placement history data management method as claimed in claim 1, wherein the electronic component mounting apparatus comprises an air blow circuit for ejecting a positive pressure from the adsorption nozzle and a flow rate sensor for measuring the flow rate of positive pressure air flowing through the air blow circuit, and the presence or absence of the adsorption nozzle is detected based on the flow rate measurement result of the flow rate sensor.

3. The nozzle placement history data management method as claimed in claim 1, wherein the electronic component mounting apparatus comprises a cover door for closing the operation range of the mount head and open/closed detection section detecting the cover door being opened or closed, and it is detected that the adsorption nozzle is once removed and then is again placed by the machine operator by combining the open/closed detection result of the cover door by the door open/closed detection section and the nozzle presence/absence detection result.

* * * * *